(12) United States Patent
Nakamura et al.

(10) Patent No.: US 8,278,567 B2
(45) Date of Patent: Oct. 2, 2012

(54) ELECTRONIC DEVICE AND METHOD OF MANUFACTURING THE SAME

(75) Inventors: Takahiko Nakamura, Chiba (JP); Keiji Sato, Chiba (JP); Hitoshi Takeuchi, Chiba (JP); Daisuke Terada, Chiba (JP); Kiyoshi Aratake, Chiba (JP); Masashi Numata, Chiba (JP)

(73) Assignee: Seiko Instruments Inc., Chiba (JP)

( * ) Notice: Subject to any disclaimer, the term of this patent is extended or adjusted under 35 U.S.C. 154(b) by 290 days.

(21) Appl. No.: 12/819,858

(22) Filed: Jun. 21, 2010

(65) Prior Publication Data

US 2010/0326721 A1 Dec. 30, 2010

(30) Foreign Application Priority Data

Jun. 26, 2009 (JP) ................................. 2009-152973

(51) Int. Cl.
*H05K 7/02* (2006.01)
(52) U.S. Cl. ........ 174/541; 174/557; 257/704; 257/737; 331/68
(58) Field of Classification Search .................... 331/68; 174/541, 557; 257/737, 704; 310/340, 344
See application file for complete search history.

(56) References Cited

U.S. PATENT DOCUMENTS

| | | | | |
|---|---|---|---|---|
| 5,438,305 A * | 8/1995 | Hikita et al. | .................... | 333/32 |
| 6,489,558 B1 * | 12/2002 | Baba et al. | .................... | 174/523 |
| 6,777,613 B2 * | 8/2004 | Okazaki | ........................ | 174/539 |
| 6,924,429 B2 * | 8/2005 | Kasai et al. | .................... | 174/565 |
| 7,123,107 B2 * | 10/2006 | Koyama et al. | .................... | 331/68 |
| 7,242,258 B2 * | 7/2007 | Hatanaka et al. | ............... | 331/68 |
| 2004/0017004 A1 * | 1/2004 | Kasai et al. | .................... | 257/704 |
| 2005/0167137 A1 * | 8/2005 | Takeuchi et al. | ............... | 174/520 |
| 2006/0022319 A1 * | 2/2006 | Matsuzawa et al. | .......... | 257/678 |
| 2007/0023888 A1 * | 2/2007 | Fujii | ............................. | 257/698 |
| 2007/0126316 A1 * | 6/2007 | Usuda et al. | .................. | 310/348 |

FOREIGN PATENT DOCUMENTS

JP 11-302034 A 11/1999
JP 2003-209198 A 7/2003

* cited by examiner

*Primary Examiner* — Hung Ngo
(74) *Attorney, Agent, or Firm* — Brinks Hofer Gilson & Lione

(57) ABSTRACT

In a structure where an electronic component is mounted on a glass base material, an external electrode is provided on an opposite side to the component mounted on the base, and a through electrode and the base are welded to each other at a temperature equal to or higher than a glass softening point, electrical conduction is ensured between the electronic component and the external electrode. An electronic device includes a base, a through electrode which pass through the base and has a metal film formed on both end surfaces after an insulating material on the surface is removed by polishing, an electronic component which is provided on one surface of the through electrode through a connection portion, an external electrode which is provided on an opposite side to a side of the base on which the electronic component is provided, and a cap which protects the electronic component on the base.

5 Claims, 6 Drawing Sheets

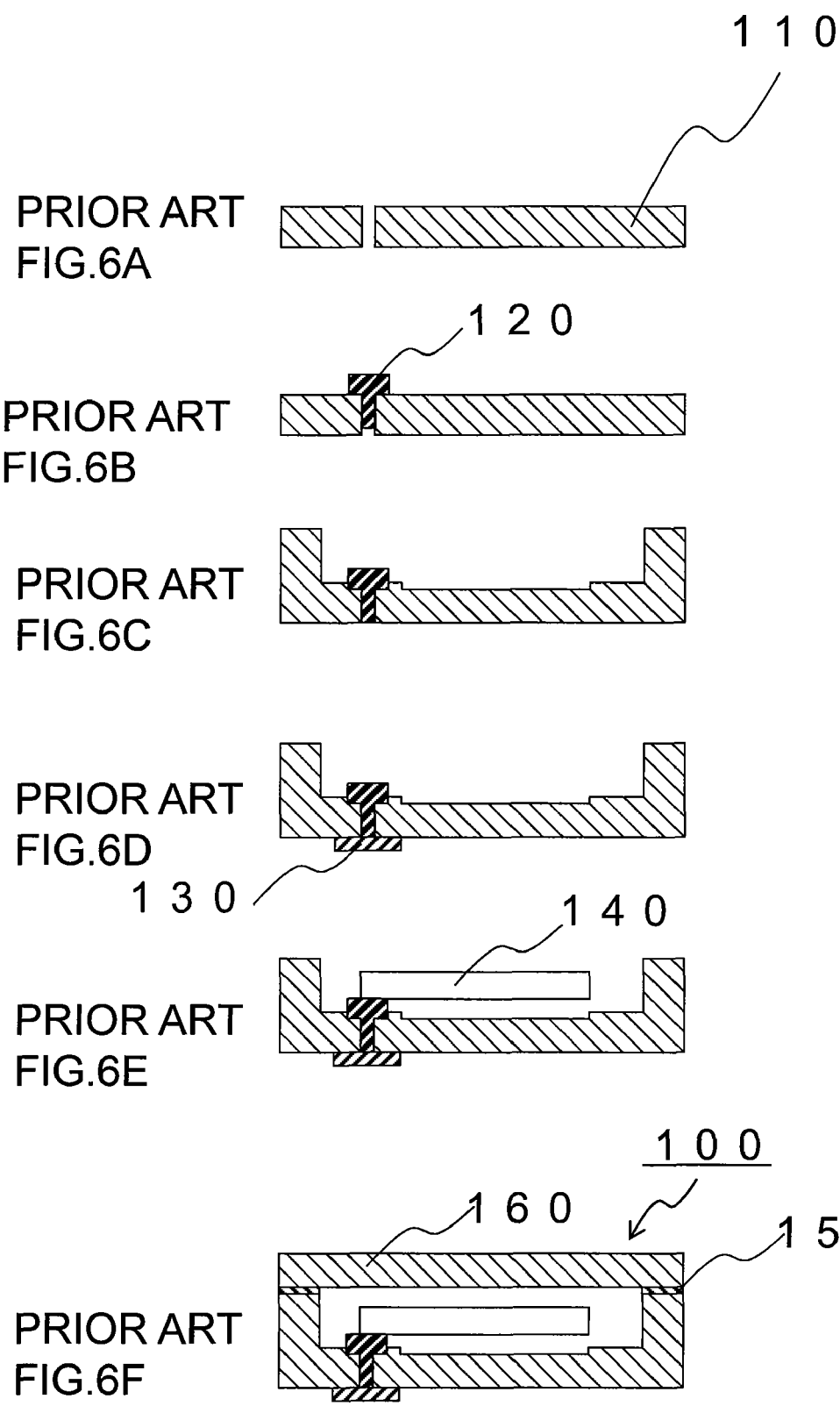
PRIOR ART FIG.6A
PRIOR ART FIG.6B
PRIOR ART FIG.6C
PRIOR ART FIG.6D
PRIOR ART FIG.6E
PRIOR ART FIG.6F

ELECTRONIC DEVICE AND METHOD OF MANUFACTURING THE SAME

RELATED APPLICATIONS

This application claims priority under 35 U.S.C. §119 to Japanese Patent Application No. 2009-152973 filed on Jun. 26, 2009, the entire content of which is hereby incorporated by reference.

BACKGROUND OF THE INVENTION

1. Field of the Invention

The present invention relates to an electronic device, which is represented by a crystal oscillator piece or a piezoelectric element, and to a method of manufacturing an electronic device.

2. The Related Art

A crystal oscillator has excellent frequency characteristics and is thus widely used as one device, specifically, as a printed board mounting component. The crystal oscillator is preferably accommodated in a sealed casing to block the effect of outside air, such that the characteristics of the crystal oscillator are stabilized. An example of such a package structure is described in "glass-ceramic composite and flat package type piezoelectric component using the same" (JP-A-11-302034) or the like.

JP-A-11-302034 describes an electronic device which has a crystal piece placed on a base with a cap. In this case, a package is formed by using a mixture of ceramic and glass powder having substantially the same thermal expansion coefficient as the crystal piece.

However, according to the technique described in JP-A-11-302034, since the package is formed of a glass-ceramic composite, the crystal piece is placed on a single base and the cap is put over the crystal piece, that is, single-part production is provided. For this reason, productivity is considerably low. Further, it is difficult to process the glass-ceramic composite, and production cost increases.

In order to resolve these problems, a method has been suggested in which a package is manufactured by easy-to-process glass. This method is described in "electronic component package" (JP-A-2003-209198) or the like.

The summary of JP-A-2003-209198 will be described with reference to FIG. 6. According to the technique described in JP-A-2003-209198, a method of manufacturing an electronic device 100 includes the steps of FIG. 6A forming a through hole in a base 110, FIG. 6B flowing low-melting-point glass into the through hole and inserting a metal pin 120, FIG. 6C fitting a metal pin 120 and recessing the glass board, FIG. 6D forming an electrode 130 by printing, FIG. 6E mounting a component, such as a crystal oscillator, on the metal pin, and FIG. 6F sealing and bonding a cap 160 and the base 110 through a sealant 150. Of these, in the step FIG. 6C, the heating temperature is equal to or higher than the softening point of glass (about 1000° C.) and glass is welded, such that the metal pin 120 is fixed closely to the base 110. Therefore, airtightness can be reliably ensured in the step FIG. 6F and the electronic device can be manufactured at low cost.

According to the manufacturing method of the electronic device 100, in the step FIG. 6C, there is a problem shown in FIG. 7. FIG. 7 is an enlarged view of the metal pin portion in the step FIG. 6C. That is, as shown in of FIG. 7A, when the metal pin 120 is short or when the fitting amount is small, low-melting-point glass 170 includes the metal pin 120. For this reason, it is impossible to ensure electrical connection between the electrode 130 which is formed in the step FIG. 6D and the metal pin 120. Further, as shown in FIG. 7B, even when the metal pin 120 is fitted as designed, since the base 110 is at a temperature equal to or higher than the softening point, glass may cover the front end of the metal pin 120. In addition, as shown in FIG. 7C, the metal pin 120 is at a temperature of about 1000° C., an oxide film 180 is grown in the vicinity of the metal pin 120, and electrical conduction is not provided between the electrode 130 and the electronic component 140.

SUMMARY OF THE INVENTION

In order to solve the above-described problems, the invention provides the following configuration.

An electronic device according to an aspect of the invention includes a glass base on which an electronic component is placed, a cap which is put over the base, and a through electrode which is electrically connected to the electronic component mounted on the base and an external electrode provided on an opposite side to the component mounted on the base. Polishing is carried out in a state where the base and the through electrode are welded to each other, and then a metal film is provided on both end surfaces of the through electrode. With this configuration, an oxide film is prevented from being grown on the surface of the through electrode after an oxide film generated at the time of welding is removed. Therefore, electrical conduction can be ensured between the electronic component and the external electrode.

In the electronic device according to the aspect of the invention, the outermost surface of the metal film on the surface of the through electrode may be formed of one selected from noble metals, such as gold, silver, platinum, palladium, rhodium, iridium, ruthenium, and osmium. With this configuration, a metal film which is unlikely to be ionized is used as cover, such that the external electrode can be more stably formed and electrical conduction can be ensured between the electronic component and the external electrode.

The through electrode may be formed of one selected from an iron-nickel alloy, a cobalt alloy, and an iron-nickel-chromium alloy. The metal film may be formed by nickel-substituted electroless plating. With this method, a noble metal film can be formed directly with good adhesion without providing an adhesive layer or a barrier layer on the through electrode. Therefore, damage to a member, such as low-melting-point glass constituting the electronic device, can be minimized. Further, since the metal film can be formed with a small number of steps, a mask which is required in film formation by sputtering is not required, such that electrical conduction can be ensured between the electronic component and the external electrode at low cost.

The metal film may be formed by calcinating metal particulates. With this method, metal particulates can be plotted by ink jet and calcinated. Therefore, a mask which is required in the usual film formation by sputtering is not required, such that electrical conduction can be ensured between the electronic component and the external electrode at low cost.

According to the aspect of the invention, at the time of welding of the base and the through electrode, the oxide film which is generated in the through electrode is removed, and then the noble metal film is formed on both end surfaces of the through electrode with no mask. Therefore, electrical connection between the through electrode, the electronic component, and the external electrode is ensured. As a result, electrical conduction can be stably provided between the electronic component and the external electrode, and manufacturing cost can be reduced.

BRIEF DESCRIPTION OF THE DRAWINGS

FIG. 6A is a diagram showing a forming process of a through hole in the base.

FIG. 6B is a diagram showing a flowing process of low-melting-point glass into the through hole and inserting a metal pin.

FIG. 6C is a diagram showing a fitting process of a metal pin and recessing process of the glass board.

FIG. 6D is a diagram showing a forming process of an electrode by printing.

FIG. 6E is a diagram showing a mounting process of a component on the metal pin.

FIG. 6F is a diagram showing a sealing and bonding process of the cap and the base through a sealant.

DETAILED DESCRIPTION OF THE PREFERRED EMBODIMENT

Figure 1:
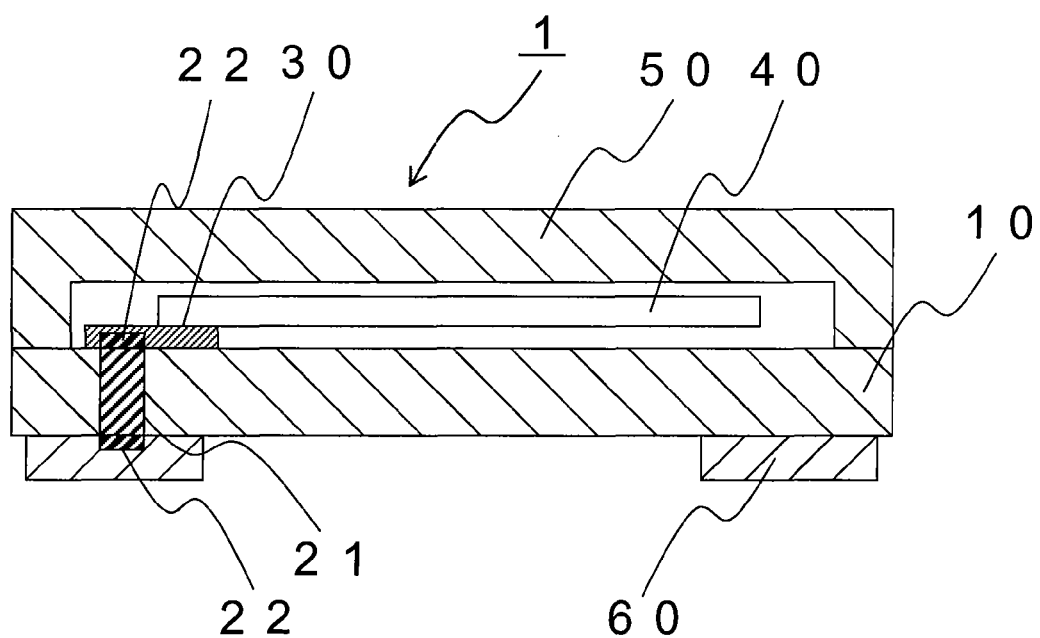
FIG. 1 is a sectional view of an electronic device according to an embodiment of the invention.

Hereinafter, an embodiment of the invention will be described in detail with reference to the drawings. FIG. 1 is a sectional view of an electronic device according to an embodiment of the invention. An electronic device 1 is constituted such that an electronic component 40 is mounted inside a package surrounded by a glass base 10 and a cap 50, and the electronic component 40 is electrically connected to an external electrode 60, which is a terminal mounted on a board, through a connection portion 30, a through electrode 21, and a metal film 22. The base is not limited to the above-described base, and for example, a silicon base may be used. The silicon base may be used in a MEMS device, such as a pressure sensor.

In FIG. 1, the electronic device 1 is a crystal oscillator in which a tuning fork-type crystal oscillator piece is mounted as an electronic component 40. In this embodiment, the electronic device is not limited to the crystal oscillator, and an electronic device, such as a semiconductor circuit, an LED, or various sensors, which can be mounted on the base, may be used.

The through electrode 21 is preferably formed of an iron-nickel alloy, a cobalt alloy, or an iron-nickel-chromium alloy. As the iron-nickel alloy, for example, a 36% Ni—Fe alloy, a 42% Ni—Fe alloy, a 45% Ni—Fe alloy, a 47% Ni—Fe alloy, a 50% Ni—Fe alloy, a 52% Ni—Fe alloy, or the like may be used. As the iron-nickel-chromium alloy, for example, a 42Ni-6Cr—Fe is used. However, other metals may be used. For example, a metal which has a thermal expansion coefficient close to the base 10 to prevent destruction due to thermal history may be used.

For the outermost surface of the metal film 22, a noble metal, such as gold, silver, platinum, palladium, rhodium, iridium, ruthenium, or osmium, is used. The noble metal is unlikely to be ionized and has corrosion resistance. Thus, it is possible to suppress deterioration until formation of the external electrode or oxidization of the through electrode 21 due to overheating after the board is mounted, and also to improve reliability of the electronic device according to the embodiment of the invention.

The metal film 22 may be formed of chromium, titanium, or the like as a base of the outermost noble metal to ensure adhesion to the through electrode 21. Further, as an anti-diffusion layer to prevent metal diffusion, a metal film may be formed of nickel or the like between the base layer and the noble metal layer.

In forming the metal film 22, sputtering is usually used, but plating may be used. When the through electrode 21 includes a nickel component, in forming the metal film 22, nickel-substituted electroless plating may be directly used. As a plating solution, for example, a neutrally substituted electroless plating solution may be used. The metal film formed by electroless plating has high adhesion to the through electrode. Further, plating is formed only on the through electrode, thus usual processing by plating may be omitted. For this reason, there is no wastefulness of the manufacturing process, as compared with sputtering and vapor deposition, such that low cost can be achieved.

A connection portion 30 includes a circuit pattern at the upper surface of the base 10, and is formed by calcinating a conductive adhesive, such as silver paste. However, depending on the configuration of the electronic component 40, no conductive adhesive may be used. For example, when gold is used for the outermost surface of the metal film, gold-gold bonding or the like by thermal compression between a gold bump formed on the electronic component 40 and the metal film on the base 10 may be used, instead of a conductive adhesive. The circuit pattern may be formed by calcinating a conductive adhesive or may be a metal thin film formed by photolithography.

The external electrode 60 is a metal thin film which is formed by sputtering or vapor deposition. Or, the base 10 is fragile, thus a conductive adhesive, such as silver paste, is used so as to ease stress at the time of mounting of the board.

Although FIG. 1 is a sectional view of a single electronic device 1, the electronic devices are produced at a wafer level, not an individual package, and are finally cut by dicing or the like. Next, a manufacturing method will be described with reference to FIGS. 2 to 5.

FIG. 2 is a diagram showing a manufacturing process of an electronic device according to the embodiment of the invention.

Figure 2A:
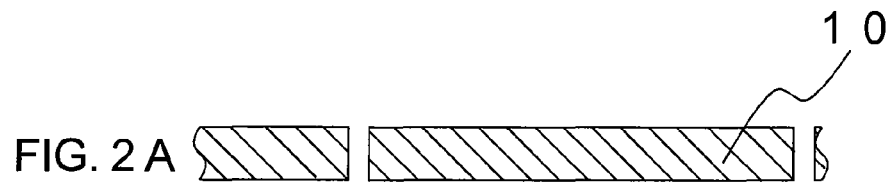
FIG. 2A is a diagram showing a forming process of a through hole in the base of the electronic device according to an embodiment of the invention.

In Step FIG. 2A, a through hole is formed in the base 10. The through hole is formed by sandblasting, laser processing, drilling, thermal pressing, or the like.

Figure 2B:
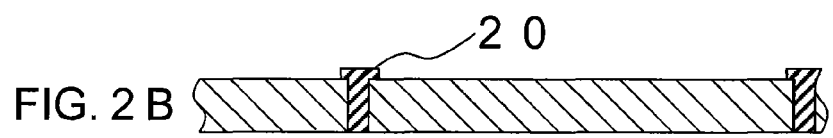
FIG. 2B is a diagram showing a applying process of low-melting-point glass to the through hole of the electronic device according to the embodiment of the invention.
Figure 3A:
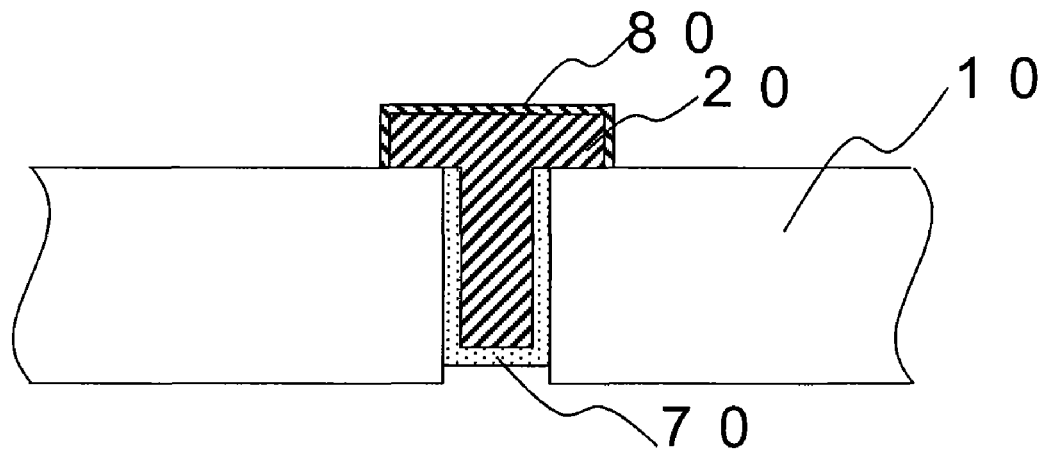
FIG. 3A is a diagram showing an enlarged view of the through electrode portion.
Figure 3B:
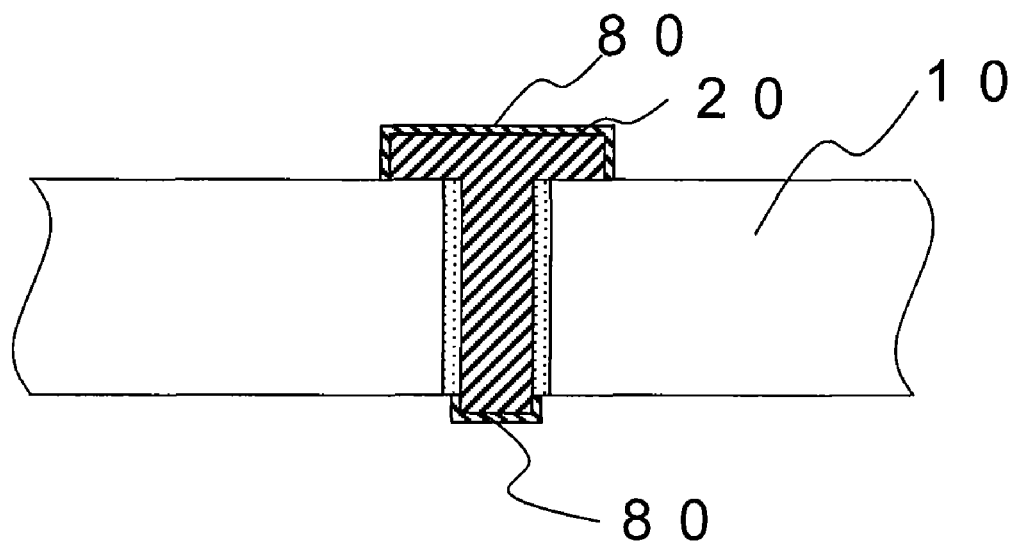
FIG. 3B is a diagram showing an enlarged view of the through electrode portion.

In Step FIG. 2B, low-melting-point glass (not shown) is applied to the through hole, and the through electrode 20 is fitted into the through hole and welded. FIGS. 3A, 3B is an enlarged view of a through electrode portion in Step FIG. 2B. The through electrode 20 has a T shape so as not to fall from the hole. In Step FIG. 2B, for glass welding, it is necessary to set the temperature at 400 to 500° C. at which at least the low-melting-point glass is molten. When no low-melting-point glass is used, it is necessary to set the temperature to be equal to or higher than the glass softening point (about 1000 C) of the base 10. For this reason, at the locations which are not covered by the base 10 and the low-melting-point glass 70, as shown in FIG. 3A and FIG. 3B, an oxide film 80 is generated, such that electrical conduction may not be provided.

Figure 2C:
FIG. 2C is a diagram showing a removing process of the low-melting-point glass of the electronic device according to the embodiment of the invention.
Figure 4:
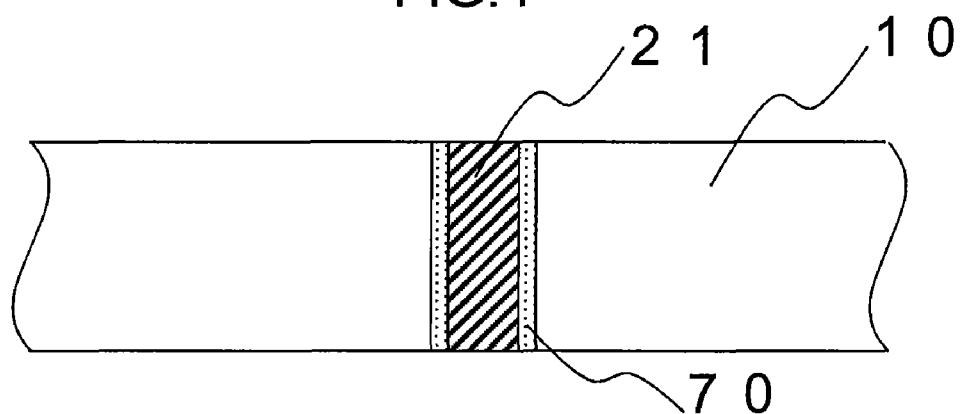
FIG. 4 is an enlarged sectional view of the through electrode portion of the electronic device according to the embodiment of the invention.

In Step FIG. 2C, a T-shaped head portion of the through electrode 20, the oxide film 80 which covers the T-shaped portion shown in FIG. 3, and the low-melting-point glass 70 are removed. FIG. 4 is an enlarged view of the through electrode portion in Step FIG. 2C. The structure shown in FIG. 4 is obtained by polishing the through electrode 20 and the base 10 thin. With this step, the oxide film 80 which covers the through electrode 20 and the low-melting-point glass 70 are eliminated, and electrical conduction can be provided between both surfaces of the base 10 through a through electrode 21.

Figure 2D:
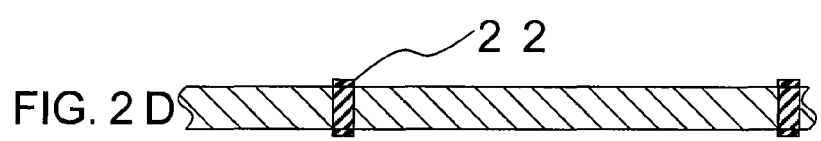
FIG. 2D is a diagram showing a forming process of a metal film formed on the polished surfaces of the through electrode of the electronic device according to the embodiment of the invention.
Figure 5:
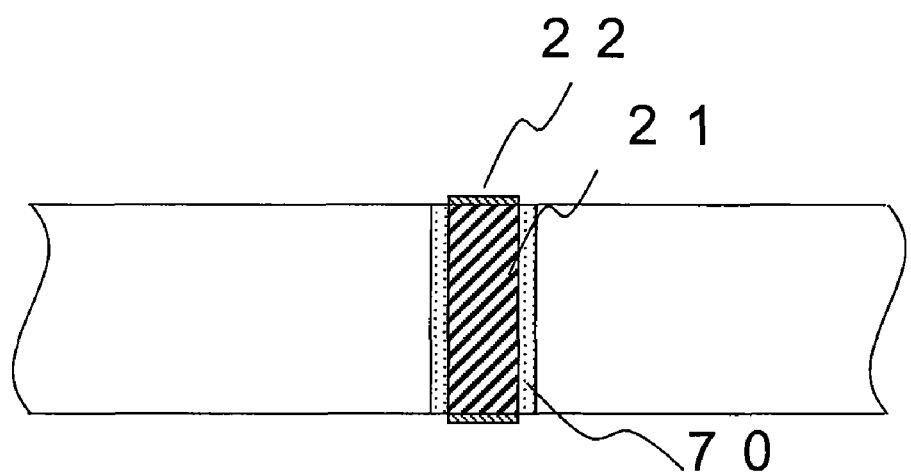
FIG. 5 is an enlarged sectional view of the through electrode portion of the electronic device according to the embodiment of the invention.
Figure 7A:
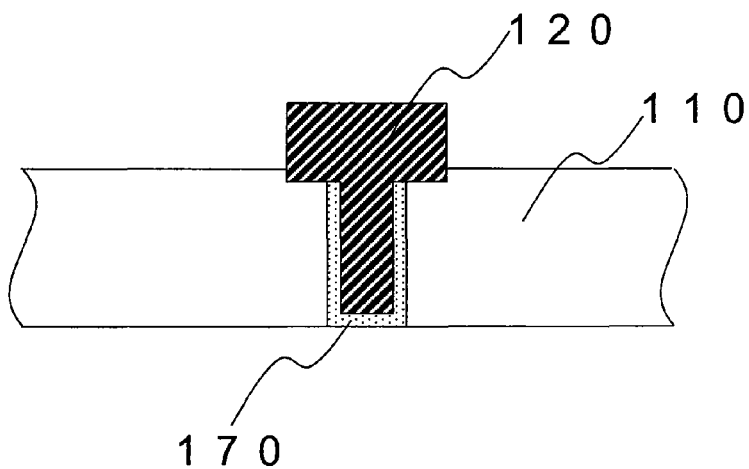
FIG. 7A is a diagram showing an enlarged view of the metal pin portion when the metal pin is short or small.
Figure 7B:
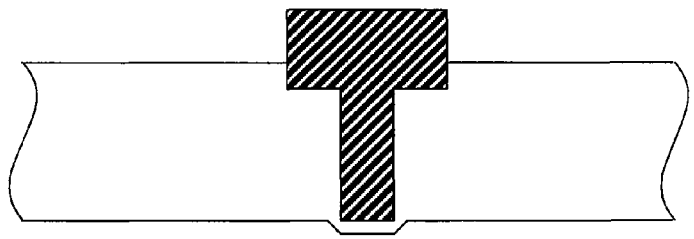
FIG. 7B is a diagram showing an enlarged view of the metal pin portion when the glass cover the front end of the metal pin.
Figure 7C:
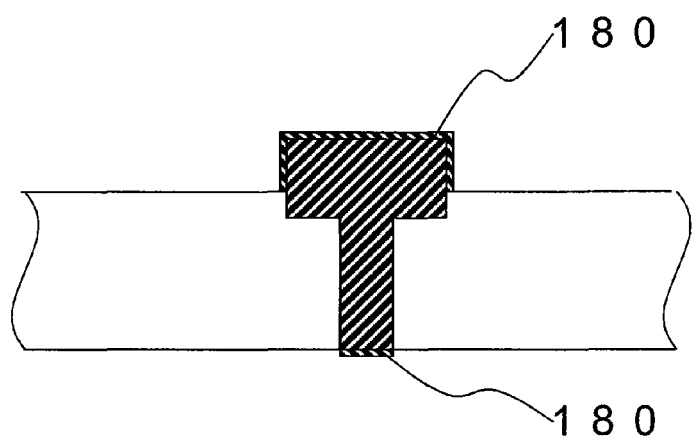
FIG. 7C is a diagram showing an enlarged view of the metal pin portion when an oxide film is grown in the vicinity of the metal pin.

In Step FIG. 2D, a metal film 22 is formed on the polished surfaces of the through electrode 21. FIG. 5 is an enlarged view of the through electrode portion in Step FIG. 2D. Electroless plating is carried out to form the metal film 22 on the end surfaces of the through electrode 21 by plating. Although a natural oxide film is formed from Step FIG. 2C to Step FIG. 2D, chemical cleaning is carried out before plating, such that the natural oxide film can be cleanly removed. With electroless plating, a mask which is required in film formation by sputtering is not required, and the metal film 22 can be formed on both end surfaces of the through electrode 21 at one time. For this reason, batch processing can be performed, and low cost and good productivity can be achieved, as compared with other methods.

The metal film 22 may be formed by calcinating metal particulates. According to this method, the metal particulates are dispersed in a solution so as to be applied by an ink jet apparatus. At this time, the position of the through electrode 21 is mapped in advance, such that the metal particulates can be applied only to the end surfaces of the through electrode 21, and the applied metal particulates can be calcinated to form the metal film 22. A natural oxide film which is formed from Step FIG. 2C to Step FIG. 2D is removed by chemical cleaning before application. The metal particulates are calcinated to form the metal film, such that no mask is required, and the electronic device can be manufactured at low cost, as compared with sputtering.

The metal film 22 may be formed by sputtering or vapor deposition and photolithography in combination. The metal film 22 is formed in such a manner, such that the through electrode 21 can be prevented from being oxidized due to overheating or the like in a subsequent step, and electrical conduction can be ensured. When the base is formed of silicon, an oxide film is formed on the base. The through electrode is not oxidized since the metal film is formed. Therefore, the oxide film is formed only on the base portion, such that the connection portion including the circuit pattern is not short-circuited. As a result, the relevant device can be used as an electronic device.

Figure 2E:
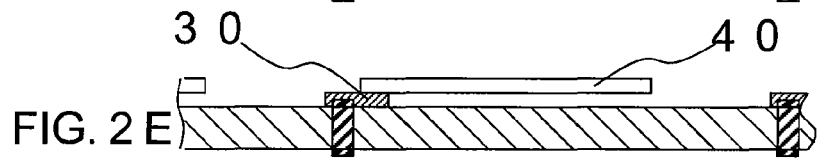
FIG. 2E is a diagram showing mounting process of the electronic component on the connection portion of the electronic device according to the embodiment of the invention.

In Step FIG. 2E, the electronic component 40 is mounted. The connection portion 30 including the circuit pattern is formed on one surface of the base including the metal film 22, and the electronic component 40 is mounted through the connection portion 30.

Figure 2F:
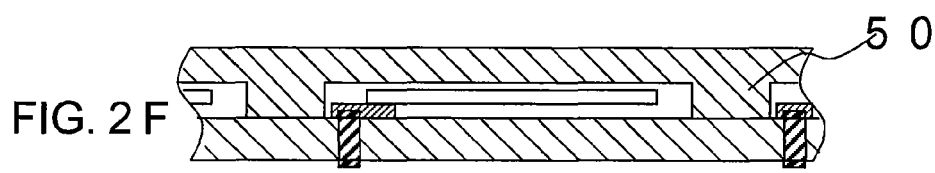
FIG. 2F is a diagram showing bonding process of the recessed cap on the base of the electronic device according to the embodiment of the invention.

In Step FIG. 2F, the recessed cap 50 is bonded to the base 10. The material for the cap 50 may be selected in consideration of the required specification of the electronic component 40, such as a bonding method, a degree of vacuum, and cost. For example, when the electronic component 40 is a crystal oscillator piece, and frequency adjustment is carried out after the base 10 and the cap 50 are bonded to each other, a glass member may be selected for the cap 50.

Figure 2G:
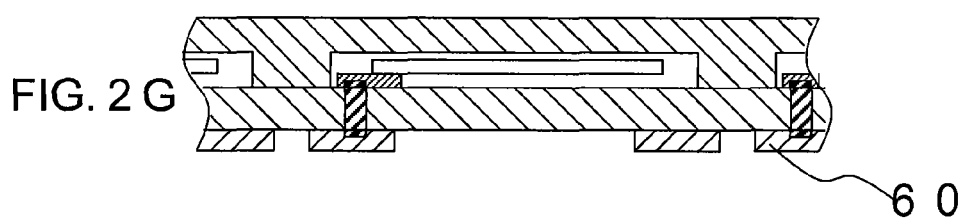
FIG. 2G is a diagram showing forming process of the external electrode of the electronic device according to the embodiment of the invention.

In Step FIG. 2G, the external electrode 60 is formed. The external electrode 60 is formed by sputtering. The external electrode 60 may be formed by printing and calcinating a conductive adhesive. A metal film may be formed on a conductive adhesive by sputtering.

Figure 2H:
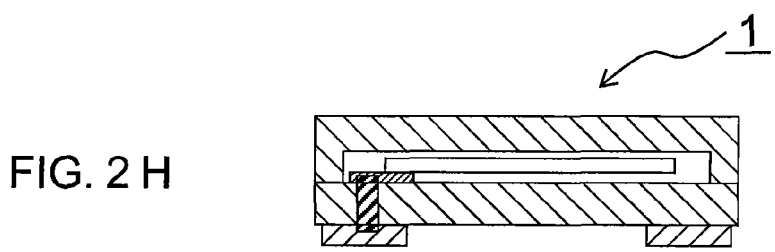
FIG. 2H is a diagram showing individualizing process of the package of the electronic device according to the embodiment of the invention.

In Step FIG. 2H, the package is individualized. Specifically, the individualization method varies depending on the material for the cap 50, and dicing or laser cutting may be carried out.

What is claimed is:

1. An electronic device comprising:
   a base which is formed of glass or silicon;
   a through electrode which passes through the base with both end surfaces of a column polished and is flush with the base;
   a metal film which covers both end surfaces of the through electrode;
   a connection portion which is electrically connected to the metal film and formed on the metal film;
   an electronic component which is provided to be electrically connected to the connection portion;
   an external electrode which is provided on an opposite side to a side of the base on which the electronic component is provided, and are electrically connected to the metal film; and
   a cap which is bonded to the base.

2. The electronic device according to claim 1,
   wherein low-melting-point glass is provided between the base and the through electrode.

3. The electronic device according to claim 2,
   wherein the outermost surface of the metal film is formed of one selected from gold, silver, platinum, palladium, rhodium, iridium, ruthenium, and osmium.

4. The electronic device according to claim 3,
   wherein the through electrode is formed of one selected from an iron-nickel alloy, a cobalt-alloy, and an iron-nickel-chromium alloy.

5. The electronic device according to claim 1,
   wherein the electronic component is a crystal oscillator piece.

* * * * *